United States Patent [19]
Brooks et al.

[11] Patent Number: 5,815,947
[45] Date of Patent: Oct. 6, 1998

[54] METHOD AND APPARATUS FOR MAINTAINING SENSITIVE ARTICLES IN A CONTAMINANT-FREE ENVIRONMENT

[75] Inventors: Ray G. Brooks; Timothy W. Brooks, both of Irving, Tex.

[73] Assignee: Convey, Inc., Euless, Tex.

[21] Appl. No.: 803,257

[22] Filed: Feb. 20, 1997

Related U.S. Application Data

[62] Division of Ser. No. 566,075, Dec. 1, 1995, Pat. No. 5,628,121.

[51] Int. Cl.⁶ ........................................................ F26B 7/00
[52] U.S. Cl. ............................................... 34/389; 34/404
[58] Field of Search .................................. 34/60, 61, 68, 34/82, 107, 187, 194, 195, 202, 218, 227, 235, 389, 404, 443; 141/98, 93; 414/225, 416, 935, 937, 941; 422/40

[56] References Cited

U.S. PATENT DOCUMENTS

| | | | |
|---|---|---|---|
| 5,303,482 | 4/1994 | Yamashita et al. | 34/218 X |
| 5,320,218 | 6/1994 | Yamashita et al. | 414/935 X |
| 5,332,013 | 7/1994 | Sugita et al. | 141/98 |
| 5,351,415 | 10/1994 | Brooks et al. | 34/389 |
| 5,359,785 | 11/1994 | Fukutomi et al. | 34/60 |
| 5,363,867 | 11/1994 | Kawano et al. | 34/18 X |
| 5,482,161 | 1/1996 | Williams et al. | 141/98 X |

*Primary Examiner*—Henry A. Bennett
*Assistant Examiner*—Steve Gravini
*Attorney, Agent, or Firm*—Geoffrey A. Mantooth

[57] ABSTRACT

Sensitive articles, such as IC wafers can be maintained in a contamination-free condition. A base member is provided for supporting one or more of the sensitive articles. A cover is provided for sealing engagement with a base member so as form a sealed unit. The sealed unit has an interior. The sealed unit is positioned at a storage position. A particle-free ionized gas is passed though the interior to bathe the articles supported therein with the gas at the storage position. The sealed unit is moved with the articles to an access position on associated processing equipment. The cover is removed from the base to expose the articles. The exposed articles are bathed continuously at the access position with a particle-free ionized gas. The articles are moved sequentially between the access position and a processing position on the associated processing equipment. The articles are bathed with a particle-free ionized gas during the moving steps. The cover is replaced on the base member so as to form the sealed unit and the sealed unit is returned with a processed wafer to the storage position.

9 Claims, 3 Drawing Sheets

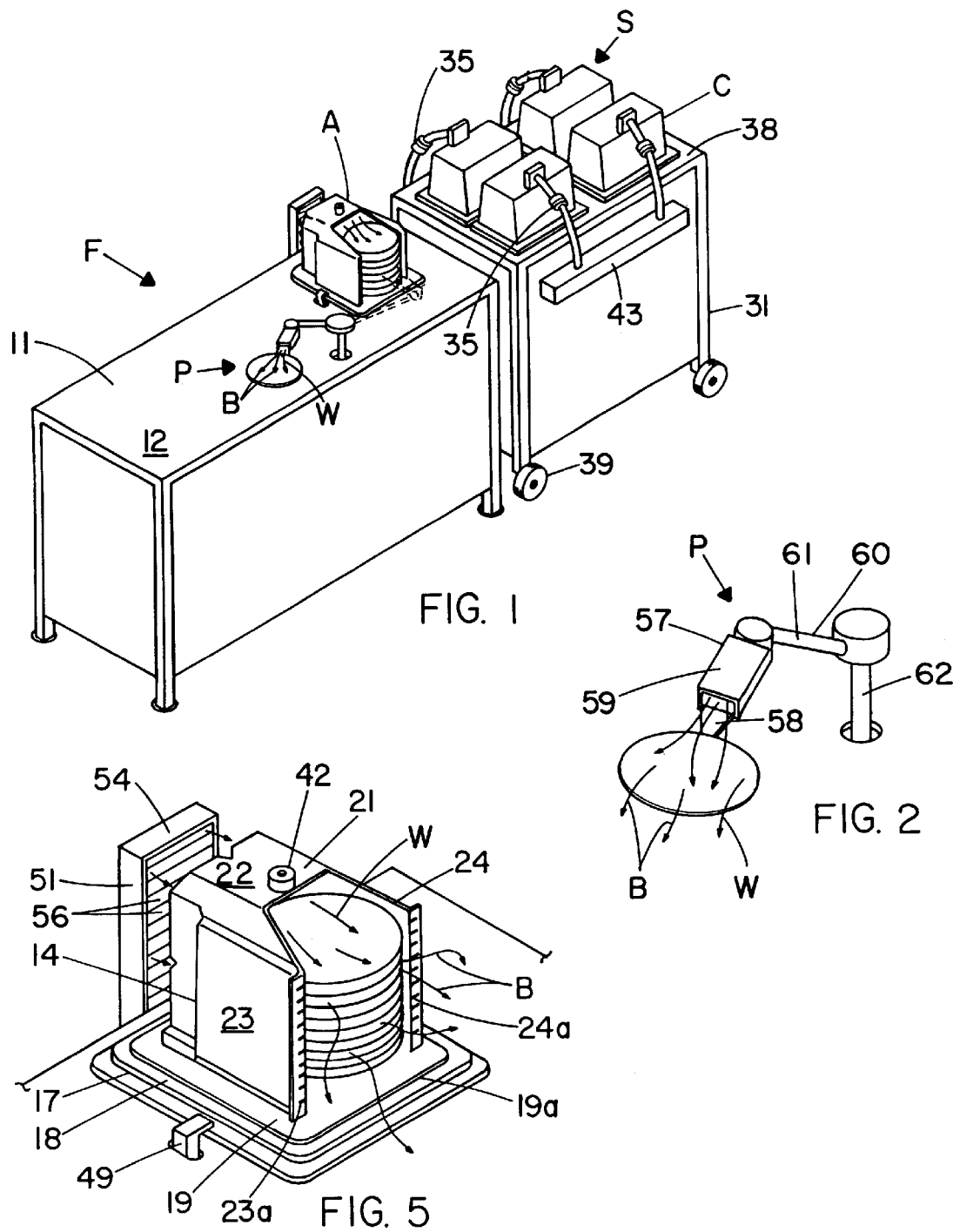

METHOD AND APPARATUS FOR MAINTAINING SENSITIVE ARTICLES IN A CONTAMINANT-FREE ENVIRONMENT

This application is a division of application Ser. No. 08/566,075, filed Dec. 1, 1995 U.S. Pat. No. 5,628,121.

SPECIFICATION

1. Field of the Invention

This invention relates to the processing of sensitive articles without contamination and more particularly to a method and apparatus for maintaining IC wafers in a perfectly clean environment during storage, transfer and processing.

2. Description of the Prior Art

Rapidly developing technology in the field of contamination-sensitive articles such as semiconductor wafers has placed increasing demands on the elimination of contaminants. The increasing sensitivity of such wafers has made the presence of even infinitesimal contaminates a drawback to quality production and the elimination of rejects.

Myriad sources of such contaminates are always present. One source is in the form of ion contaminates from plastic boxes or cassettes in which the wafers are placed as well as people and equipment. Such ion contaminants migrate to wafer surfaces and can cause circuit degradation due to caustic and/or corrosive elements such as CL, PO4, NO3, NA and K found in polymeric material. When these polymeric material "outgas", these elements become mobile with environmental moisture and the rate of movement is dependent on charges on the wafer surfaces.

Other source is particulates found in clean rooms which are generated by people and equipment. Such particulates can be attracted to wafer surfaces (depending on unlike charges) where they cause circuitry degradation.

A further source is electrostatic charges generated by the motion of wafers, equipment, cassettes/boxes and people. Such electrostatic charges degrade the integrity of wafer circuitry due to uncontrolled electrostatic discharge (ESD).

Various proposals have been advanced to maintain an exceptionally clean environment for the fabrication of wafers. One of the earliest efforts was the provision of clean rooms with filtration (HEPA) and an ionization system. In such arrangements, the ionizing system is usually located near the ceiling so as not to interfere with personnel or equipment. As the work pieces in such rooms are more or less equidistant from the positive and negative high voltage emitters, buildup of unipolar charges are avoided. However, technology changes in wafer processing has led to the need for an even cleaner work environment which can be obtained by a reduction in the contaminate-free zone in which the work is carried out.

One prior effort in this direction is disclosed in U.S. Pat. No. 4,674,956, No. 4,532,970 and No. 4,534,389 wherein wafers are disposed in a portable airtight plastic box known as a "pod" that mechanically interfaces with an airtight canopy. However, use of this concept with clean room ionization systems results in the buildup of harmful static charges on the "pod" surfaces due to the proximity of the emitter points.

A more effective system is shown in U.S. Pat. No. 5,351,415 wherein an airtight transportable plastic container for wafers is disclosed. This container includes an inlet valve and an outlet valve which permit an ionizing gas to be continuously passed through the container at an intermediate stage in wafer processing and/or storage. With this arrangement, contamination of the wafers within the container from plastic "outgassing" or the like is avoided.

SUMMARY OF THE INVENTION

Accordingly, a primary object of this invention is to provide a new and novel method and apparatus for maintaining sensitive articles such as semiconductor wafers in an extremely clean environment during processing.

Another object of this invention is to provide a new and novel method and apparatus for maintaining IC wafers contamination-free before, during and after wafer processing.

A further object of this invention is to provide a new and novel method and apparatus for maintaining IC wafers contamination-free for prolonged periods including processing which utilizes existing equipment and containers with a minimum of modification.

Still another object of this invention is to provide a new and novel method and apparatus for maintaining semiconductor wafers contamination-free in a minimum environmental volume of ionizing gas during storage, transfer and fabrication.

A still further object of this invention is to provide a new and novel method and apparatus for moving IC wafers from storage to a process tool and back to storage in a contamination-free environment.

A further object of this invention is to provide a new and novel method and apparatus for maintaining IC wafers contamination-free during storage and fabrication using techniques which lend themselves to robotics.

Still another object of this invention is to provide a new and novel method and apparatus in which wafers stored in a contamination-free environment may be easily moved to a selected processing station without contamination.

The objects of the invention and other related objects are accomplished by the provision of a contamination-free sealed unit including a cover and a base member in which IC wafers are stacked and which is stored in a storage position on a movable table having a source of particle-free ionized gas. The unit includes an inlet and outlet to permit the gas to be passed into and out of the unit interior over the wafers. For wafer processing, the unit is transferred from the table without interruption of the gas flow to an access position on an associated process tool also having a source of particle-free ionized gas so that when the cover is removed, gas flows over the stacked wafers at the access position. From the access station, the wafers are sequentially moved to and from an appropriate work on the process tool with continuous bathing of the wafers during such movement with an ionized gas for subsequent replacement of the cover and return of the unit to the storage position so that the wafers are subjected to the ionized gas before, during and after the processing operations.

BRIEF DESCRIPTION OF THE DRAWINGS

FIG. 1 is a perspective view of a wafer storage and processing system incorporating the method and apparatus of the invention;

FIG. 2 is an enlarged perspective view of a portion of the wafer processing apparatus of FIG. 1;

FIG. 5 is a perspective view of the base member of FIG. 4 in an access position during processing.

DESCRIPTION OF THE PREFERRED EMBODIMENT

Figure 3:
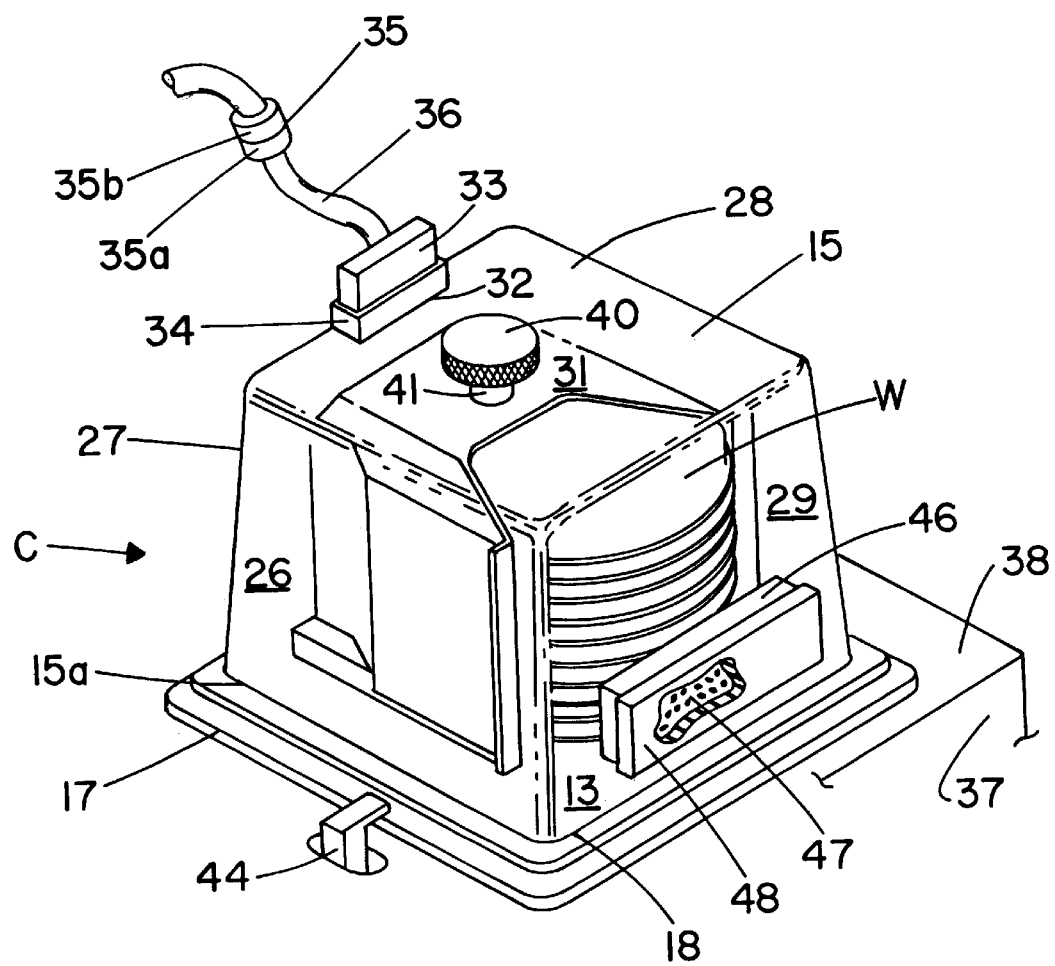
FIG. 3 is an enlarged perspective view of the wafer container incorporated in the apparatus of FIG. 1.

Referring now to the drawings and to FIG. 1 in particular, there is shown a fabrication or processing installation for sensitive articles such as semiconductor wafers which incorporates the apparatus of the invention. The fabrication installation designated generally by the letter F in FIG. 1, includes a process tool 11 of conventional construction shown in the form of a work bench having a top or working surface 12. The process tool 11 is arranged to perform various well-known operations on wafers W at work stations on the tool 11, one of which is shown in FIG. 2 and designated generally by the letter P.

Referring now to FIG. 3, there is shown a container or sealed unit designated generally by the letter C in which wafers W to be processed are stored in a contamination-free environment. The container C is similar to that shown in the aforementioned U.S. Pat. No. 5,351,415 having an interior into which an ionized gas is introduced and exited therefrom to maintain the wafers in a contamination-free environment.

More specifically, the container C which is formed of a suitable plastic material includes a base member 14 and a cover 15 adapted for tight-fitting engagement to provide a sealed interior 13 as shown best in FIG. 3.

As shown best in FIG. 5, the base member 14 preferably includes a plurality of rectangular base plates 17–19 with the uppermost plate 19 having a peripheral edge 19a for sealing engagement with the lower peripheral edge 5a of the cover 15. Suitably secured to the upper surface of the base member 14 is an upright, U-shaped housing or boat 21 for supporting a plurality of wafers W in a stacked, vertically-spaced relationship as shown in FIG. 5. The boat 21 includes a top wall 22 and a pair of laterally spaced side walls 23, 24 having laterally aligned slots 23a, 24a respectively for receiving the wafers W. The boat 21 is therefore open at both ends.

The base member 14 and cover 15 are preferably molded of a suitable plastic material such as polypropylene. The cover 15 includes side walls 26–29 and a top wall 31 having an inlet 32 to the unit interior 13. The cover inlet 32 includes an inlet valve 33 and an ionizer 34 connected by means of a conduit 36 to a source of electric power and a source of gas such as air for processing by the ionizer 34.

Preferably, intermediate its ends, the conduit 36 is provided with a connector 35 of the type commonly referred to as a "quick-disconnect" having interengaging components 35a, 35b. Thus, in those situations where it is desirable to store a unit or container C for an indefinite period of time, the container C can be easily disconnected at the connector 35 with the purified interior 13 being maintained for a prolonged period.

Referring now again to FIG. 1, the sources of electric power and gas are preferably provided within an enclosure or table 37 generally referred to as a "purger table" having a top surface 38 and preferably provided with wheels 39 for wheeled movement on a supporting surface into a selected position adjacent the process tool 11.

The container cover 15 is releasably retained in the assembled position with the base member 14 by means of a suitable latch 40 which in the illustrated embodiment comprises a manually actuated rod 41 on the cover top wall 31 releasably engageable with a catch 42 on the top wall 22 of the boat 21.

A plurality of containers C may be positioned in a storage position identified by the letter S on the top 38 of the table 37, four of such containers being shown in the embodiment of FIG. 1. The conduits 36 of each of the containers C are connected to a source of gas (not shown) within the table 37 preferably by means of manifolds 43 and to the source of electric power through suitable conductors automatically by suitable switching means (not shown) when the cover 15 is positioned on the base member 14. Conversely, power and gas flow are interrupted when the cover 15 is removed from the base member 14.

In order to retain the containers C on the table top 38, releasable means such as spaced-apart latches 44 are provided table top which releasably engage opposite edges of the base member plate 17 as shown best in FIG. 3. These latches 44 are controlled by manually actuated switch means (not shown). The latches 44 may be moved between the position shown in FIG. 3 in gripping engagement with opposite edges of the base plate 17 of the base member 14 and a retracted position for releasing the base member 14.

During the time the containers C are held on the table top 38, ionized gas flows continuously through the container interior 13 to bath the wafers W stored therein and out of the container through an outlet 46 in the container cover 15 to maintain a contamination-free environment in the container interior 13. Preferably, the outlet 46 is provided with a filter 47 and a freely pivotal flap 48 is mounted on the outlet 46 over the filter.

To process the wafers W held within a container C, with the table 37 positioned as shown in FIG. 1, a sealed unit or container C is lifted from the table top 38 and moved into an access position identified by the letter A on the top surface 12 of the process tool 11. This movement is permitted by the flexibility of the conduit 36 and the flow of gas into the container interior 13 continues during such movement. The container C is retained in this access position by means of spaced-apart, releasable latches 49 which engage the edge portions of the base plate 17 similar to the latches 44. The latches 49 are also operated similarly to the latches 44 by suitable switch means (not shown).

Figure 4:
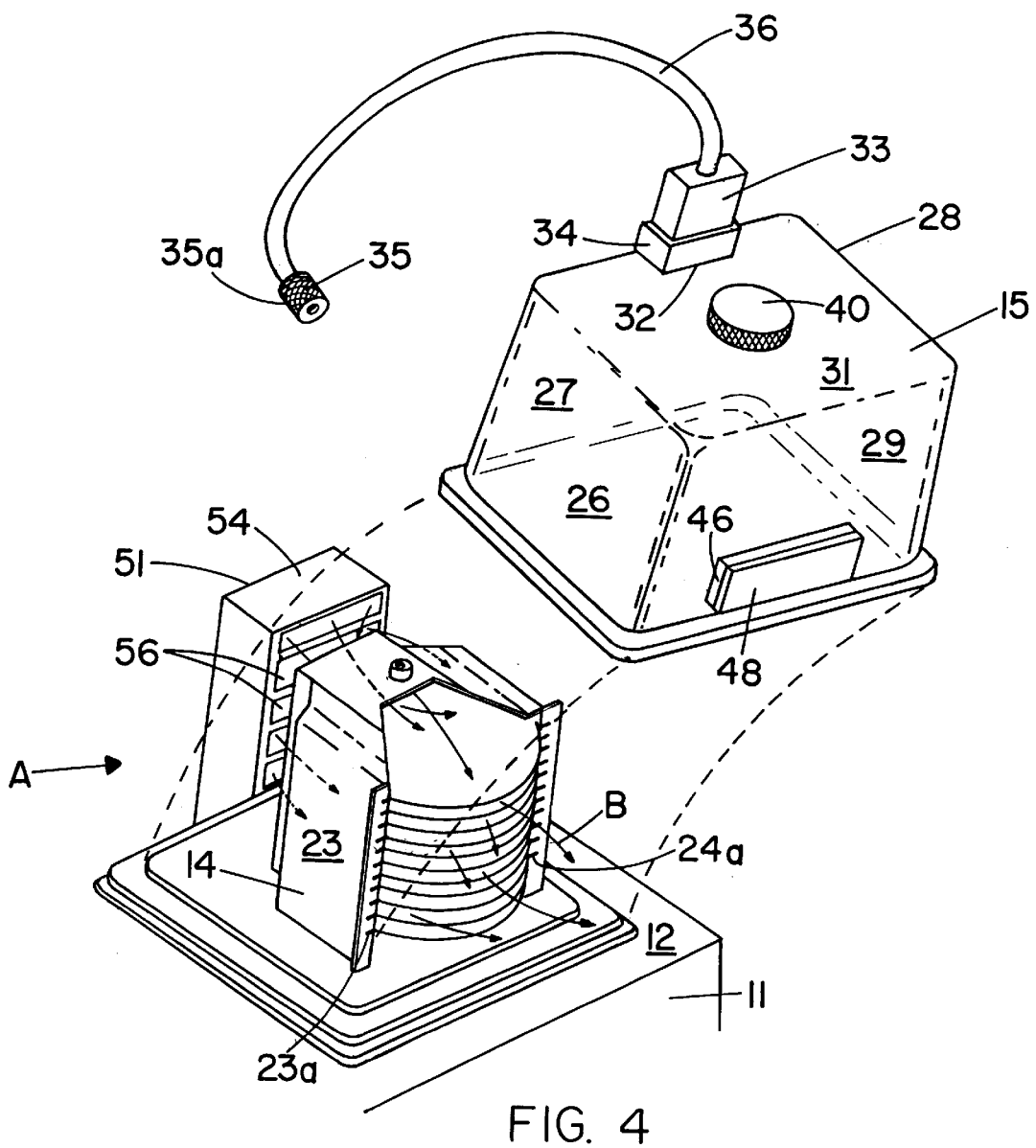
FIG. 4 is a perspective view of the container of FIG. 3 showing the cover and base member portions of the container in a separated condition.

As shown best in FIG. 5, the access position A on the work bench surface 12 is located adjacent a source of particle-free ionized gas suitably supported on the work bench 11. At the access position A, the cover 15 is removed from the base member 14 as shown best in FIG. 4 so that the open end at the rear of the boat 21 is exposed to the flow of gas in the direction of arrows B from the source 51. Removal of the cover 15 actuates suitable switch means for interrupting the gas flow through conduit 36.

The particle-free ionized gas source 51 includes an upstanding framework 54 having a plurality of louvers 56 for distributing the ionized gas therefrom over the wafers W in the direction of the arrows B. As can be seen, the ionized gas enters the rear end of the U-shaped housing or boat 21 and flows between the side walls 23, 24 over the wafers W thereby continuously maintaining the wafers W in a contamination-free environment until ready for processing.

In order to carry out the processing of the wafers W exposed at the access position A, a single wafer W is removed from the stack by a wand 57 as shown in FIG. 2 at the process station P. The wand 57 includes a vacuum pickup or spade 58 and an ionized gas spray 59 as described and claimed in U.S. Pat. No. 5,351,415—Brooks et al.

As the apparatus of the invention lends itself to robotics, the wand 57 is supported for reciprocating movement on a linkage 60 including an arm 61 and rotary shaft 62 for movement between the solid line and broken line positions of FIG. 1.

To move a wafer W from the stack contained in the boat 21 at access position A, the ionizer 59 and vacuum spade 58 are activated and the wand 57 moved through movement of the linkage 60 into the broken line position of FIG. 1 for gripping engagement with a wafer. The wafer W is then moved into the solid line position of FIGS. 1, 2 with ionizing gas flowing at all times over the wafer in the direction of the arrows H. As can be understood, the wafer W may be processed at successive process stations at all of which ionizing gas can be applied either continuously or intermittingly as desired for a contamination-free environment.

After completion of the fabrication processes on each of the wafers, the processed wafers are returned sequentially to the wafer stack at the access position A. Wafer return is accomplished by the linkage 60 with continuous actuation of the ionizer 59 as shown in broken lines in FIG. 1.

When the entire stack of wafers has been processed, the cover 15 is once again placed over the base member 14 in sealing engagement therewith and the flow of ionized gas into the container interior 13 resumed. Subsequently, the latch 49 is released and the container C returned to the storage position S on the table 37.

It is obvious that the physical components of the apparatus could be arranged in a variety of other configurations as long as base 14, wafer W within boat 21 and removable cover 15 are capable of operative association with process equipment 11.

Thus at all times, before, during and after wafer processing, the wafers W are subjected to the beneficial effect of a particle-free ionized gas to retain the wafers in a contamination-free environment.

We claim:

1. A method of maintaining sensitive articles, said articles comprising wafers, in a contamination-free condition comprising the steps of, providing a base member for supporting one or more sensitive articles, providing a cover for sealing engagement with said base member to form a sealed unit having an interior, positioning said sealed unit at a first position, passing a particle-free ionized gas through said interior to bathe said articles supported therein with said gas at said first position, moving said sealed unit with said articles to a second position on associated processing equipment, removing said cover from said base to expose said articles, bathing said exposed articles continuously at said second position with a particle-free ionized gas, moving said articles sequentially between said second position and a third position on said associated processing equipment, bathing said articles with a particle-free ionized gas during said moving steps, and replacing said cover on said base member to form said sealed unit.

2. A method in accordance with claim 1 including the step of providing a moveable support for said sealed unit at said first position.

3. A method in accordance with claim 2 including the step of installing said source of particle-free ionized gas for said sealed unit on said moveable support.

4. A method of providing a contaminant-free environment for sensitive articles, comprising the steps of:

a) providing a sealed container, said container having an interior, said articles being located in said interior;

b) while said container is sealed, passing a particle-free ionized gas through the interior of said sealed container so as to bathe said articles with said gas;

c) opening said container so as to allow the transfer of said articles to and from said container interior;

d) continuously bathing said articles in said open container with a particle-free ionized gas passing through the interior of said open container.

5. The method of claim 4 wherein said articles comprise integrated circuit wafers.

6. The method of claim 4 wherein the step of passing a particle-free ionized gas through the interior of said sealed container further comprises the step of providing said gas into said container through a first port in said container, the step of bathing said articles in said open container with a particle-free ionized gas further comprises the step of providing said gas into said container through a second port in said container.

7. The method of claim 6 further comprising the step of transferring said articles from the interior of said opened container to a processing station by way of a third port in said open container.

8. The method of claim 4 further comprising the step of moving said sealed container from a first position to a second position before opening said container.

9. The method of claim 4 further comprising resealing said open container and passing a particle-free ionized gas through the interior of said resealed container so as bathe said articles with said gas.

* * * * *